(12) United States Patent
Patel et al.

(10) Patent No.: US 10,469,122 B2
(45) Date of Patent: Nov. 5, 2019

(54) TECHNIQUES FOR LOW-LOSS MULTI-BAND MULTIPLEXING

(71) Applicant: QUALCOMM Incorporated, San Diego, CA (US)

(72) Inventors: Chirag Dipak Patel, San Diego, CA (US); Lai Kan Leung, San Marcos, CA (US); Zhang Jin, San Diego, CA (US); Chinmaya Mishra, San Diego, CA (US); Ravi Sridhara, San Diego, CA (US); Youngchang Yoon, Seoul (KR)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/872,695

(22) Filed: Jan. 16, 2018

(65) Prior Publication Data
US 2018/0205413 A1    Jul. 19, 2018

Related U.S. Application Data

(60) Provisional application No. 62/447,278, filed on Jan. 17, 2017.

(51) Int. Cl.
*H04B 1/44* (2006.01)
*H04W 72/04* (2009.01)
(Continued)

(52) U.S. Cl.
CPC .............. *H04B 1/44* (2013.01); *H03F 1/486* (2013.01); *H03F 1/56* (2013.01); *H03F 3/19* (2013.01);
(Continued)

(58) Field of Classification Search
CPC ...... H04B 1/44; H04B 1/0057; H04B 1/0458; H04B 1/18; H04B 1/48; H03F 1/486;
(Continued)

(56) References Cited

U.S. PATENT DOCUMENTS 8,838,042 B2    9/2014  Lu et al.
8,913,976 B2   12/2014  Khatri et al.
(Continued)

OTHER PUBLICATIONS

International Search Report and Written Opinion issued in International Patent Application No. PCT/US2018/014001, dated May 30, 2018 (16 pages).

*Primary Examiner* — Obaidul Huq
(74) *Attorney, Agent, or Firm* — Arent Fox, LLP and Qualcomm, Incorporated

(57) ABSTRACT

Various aspects described herein relate to low-loss multi-band multiplexing schemes for a wireless communications system, for example, a 5th Generation (5G) New Radio (NR) system. In an aspect, a multiplexer for multi-band wireless communications comprises at least one tuning component configured to transmit or receive at least one signal within a frequency band that is selected from a plurality of frequency bands. The multiplexer further comprises at least one combining component, communicatively coupled with the at least one tuning component, configured to transmit or receive the at least one signal within the selected frequency band. In an aspect, the at least one tuning component is integrated on a chip and the at least one combining component is not integrated on the chip.

30 Claims, 10 Drawing Sheets

(51) Int. Cl.

| | | |
|---|---|---|
| *H04L 5/14* | (2006.01) | |
| *H03F 1/48* | (2006.01) | |
| *H03F 3/19* | (2006.01) | |
| *H03F 1/56* | (2006.01) | |
| *H03F 3/24* | (2006.01) | |
| *H03H 7/46* | (2006.01) | |
| *H04B 1/00* | (2006.01) | |
| *H04B 1/04* | (2006.01) | |
| *H04B 1/18* | (2006.01) | |
| *H04B 1/48* | (2006.01) | |
| *H03F 3/195* | (2006.01) | |

(52) U.S. Cl.
CPC .............. *H03F 3/195* (2013.01); *H03F 3/245* (2013.01); *H03H 7/463* (2013.01); *H04B 1/0057* (2013.01); *H04B 1/0458* (2013.01); *H04B 1/18* (2013.01); *H04B 1/48* (2013.01); *H04L 5/14* (2013.01); *H04W 72/0453* (2013.01); *H03F 2200/111* (2013.01); *H03F 2200/222* (2013.01); *H03F 2200/294* (2013.01); *H03F 2200/387* (2013.01); *H03F 2200/421* (2013.01); *H03F 2200/451* (2013.01); *H04L 5/143* (2013.01)

(58) Field of Classification Search
CPC ... H03F 1/56; H03F 3/19; H03F 3/195; H03F 3/245; H03F 2200/111; H03F 2200/222; H03F 2200/294; H03F 2200/387; H03F 2200/421; H03F 2200/451; H03H 7/463; H04L 5/14; H04L 5/143; H04W 72/0453
USPC .......................................... 370/276, 277, 280
See application file for complete search history.

(56) References Cited

U.S. PATENT DOCUMENTS

| | | | |
|---|---|---|---|
| 9,559,745 | B2 | 1/2017 | Bendixen et al. |
| 9,608,749 | B2 | 3/2017 | Mueller et al. |
| 2003/0100333 | A1 | 5/2003 | Standke et al. |
| 2007/0024377 | A1 | 2/2007 | Wang et al. |
| 2009/0141833 | A1* | 6/2009 | Kim ..................... H04B 1/0053 375/340 |
| 2013/0288612 | A1* | 10/2013 | Afsahi .................. H03F 1/0222 455/73 |
| 2014/0354372 | A1 | 12/2014 | Zuo et al. |
| 2014/0361847 | A1 | 12/2014 | Goldblatt et al. |
| 2015/0003306 | A1 | 1/2015 | Domino et al. |
| 2015/0303974 | A1* | 10/2015 | Domino ................ H04B 1/006 370/297 |
| 2015/0304059 | A1 | 10/2015 | Zuo et al. |

\* cited by examiner

39GHz Mode:

| Zin, (towards LNA) | 28G | 39G |
|---|---|---|
| 1 | 0 | 0 |
| 2 | Ind | ∞ |

TECHNIQUES FOR LOW-LOSS MULTI-BAND MULTIPLEXING

CROSS-REFERENCE TO RELATED APPLICATION

This application claims the benefit of U.S. Provisional Application Ser. No. 62/447,278, entitled "TECHNIQUES FOR LOW-LOSS MULTI-BAND MULTIPLEXING" and filed on Jan. 17, 2017, which is expressly incorporated by reference herein in its entirety.

BACKGROUND

Aspects of the present disclosure relate generally to wireless communications systems, and more particularly, to low-loss multi-band multiplexing (e.g., duplexing) schemes used for wireless communications systems (e.g., 5G New Radio).

Wireless communications systems are widely deployed to provide various telecommunication services such as telephony, video, data, messaging, and broadcasts. Typical wireless communications systems may employ multiple-access technologies capable of supporting communications with multiple users by sharing available system resources (e.g., time, frequency, power, and/or spectrum). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA).

These multiple access technologies have been adopted in various telecommunication standards to provide a common protocol that enables different wireless devices to communicate on a municipal, national, regional, and even global level. An example telecommunication standard is Long Term Evolution (LTE) or LTE-Advanced (LTE-A). However, although newer multiple access systems, such as an LTE or LTE-A system, deliver faster data throughput than older technologies, such increased downlink rates have triggered a greater demand for higher-bandwidth content, such as high-resolution graphics and video, for use on or with mobile devices. As such, demand for bandwidth, higher data rates, better transmission quality as well as better spectrum utilization, and lower latency on wireless communications systems continues to increase.

The 5th Generation (5G) New Radio (NR) communications technology, used in a wide range of spectrum, is envisaged to expand and support diverse usage scenarios and applications with respect to current mobile network generations. In an aspect, 5G NR communications technology includes, for example: enhanced mobile broadband (eMBB) addressing human-centric use cases for access to multimedia content, services and data; ultra-reliable low-latency communications (URLLC) with strict requirements, especially in terms of latency and reliability; and massive machine type communications (mMTC) for a very large number of connected devices and typically transmitting a relatively low volume of non-delay-sensitive information. As the demand for mobile broadband access continues to increase, there exists a need for further improvements in 5G communications technology and beyond. Preferably, these improvements should be applicable to other multi-access technologies and the telecommunication standards that employ these technologies.

Accordingly, due to the requirements for increased data rates, higher capacity, low-power consumption, and system reliability and flexibility, new approaches may be desirable to support low-loss multi-band operations, in order to satisfy consumer demand and improve user experience in wireless communications, such as 5G NR communications.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

According to an example, a multiplexer for multi-band wireless communications is provided. In an aspect, the multiplexer comprises at least one tuning component configured to transmit or receive at least one signal within a frequency band that is selected from a plurality of frequency bands. The multiplexer further comprises at least one combining component, communicatively coupled with the at least one tuning component, configured to transmit or receive the at least one signal within the selected frequency band. In an aspect, the at least one tuning component is integrated on a chip and the at least one combining component is not integrated on the chip.

In an aspect, a method related to multi-band operations in a wireless communications system is provided. The method may include selecting a frequency band from a plurality of frequency bands, and adjusting at least one tuning component to transmit or receive at least one signal within the selected frequency band. The method may also include transmitting or receiving the at least one signal within the selected frequency band using at least one combining component. In an aspect, the at least one tuning component is on a chip, and the at least one combining component is not on the chip.

In another aspect, a multiplexer for multi-band wireless communications is provided. The multiplexer may comprise means for selecting a frequency band from a plurality of frequency bands, and means for adjusting at least one tuning component to transmit or receive at least one signal within the selected frequency band. The multiplexer may also comprise means for transmitting or receiving the at least one signal within the selected frequency band using at least one combining component. In an aspect, the at least one tuning component is on a chip, and the at least one combining component is not on the chip.

In a further aspect, a computer-readable medium storing computer code executable by a processor for multi-band wireless communications is provided. The computer-readable medium may comprise code for selecting a frequency band from a plurality of frequency bands, and code for adjusting at least one tuning component to transmit or receive at least one signal within the selected frequency band. The computer-readable medium may also comprise code for transmitting or receiving the at least one signal within the selected frequency band using at least one combining component. In an aspect, the at least one tuning component is on a chip, and the at least one combining component is not on the chip.

To the accomplishment of the foregoing and related ends, the one or more aspects comprise the features hereinafter fully described and particularly pointed out in the claims.

The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

In order to facilitate a fuller understanding of aspects described herein, reference is now made to the accompanying drawings, in which like elements are referenced with like numerals. These drawings should not be construed as limiting the present disclosure, but are intended to be illustrative only.

DETAILED DESCRIPTION

Figure 1:
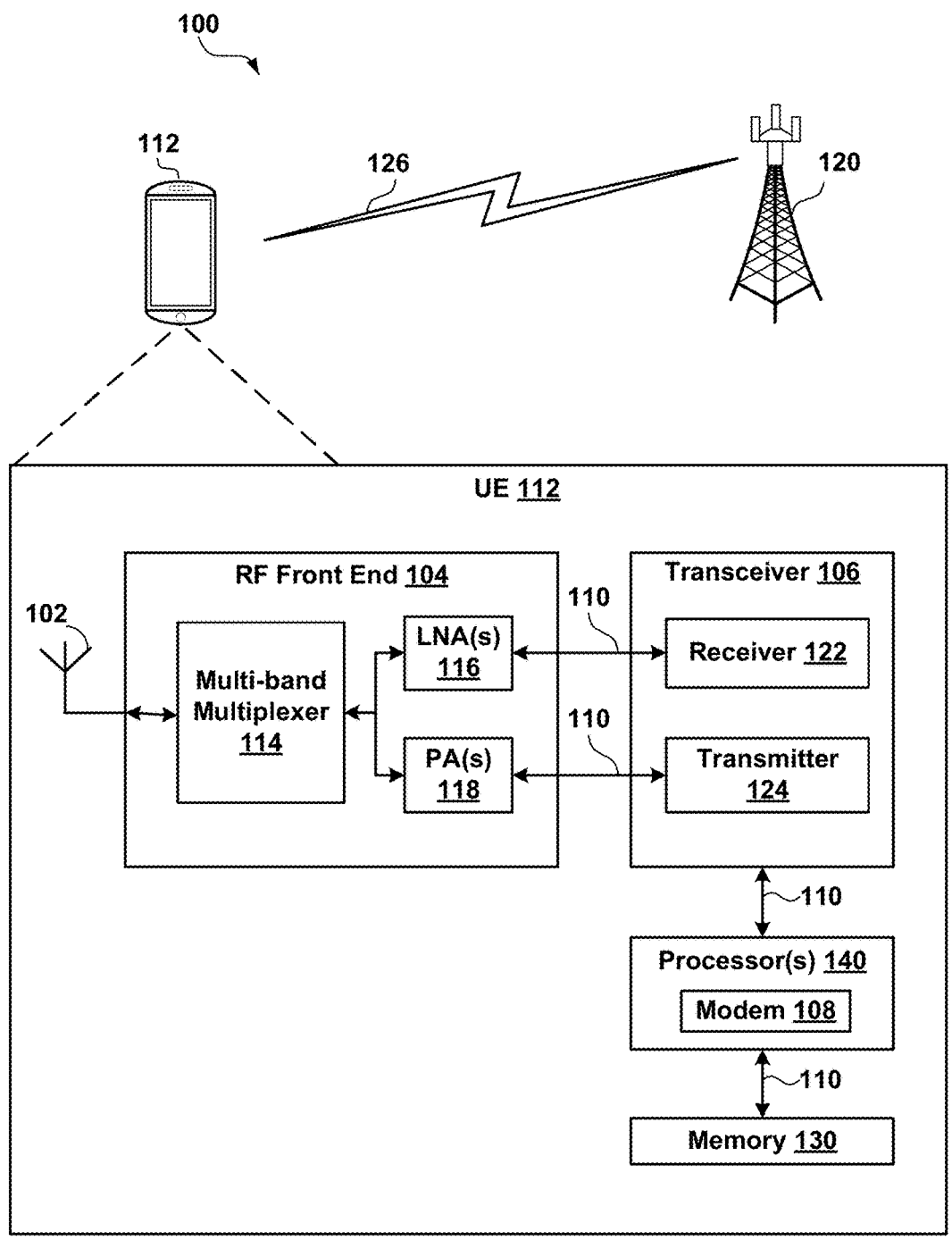
FIG. 1 is a block diagram of an example communications network including at least one network entity in communication with one user equipment configured to perform multi-band operations, according to one or more of the presently described aspects.

In wireless communications systems, for example, the 5th Generation (5G) New Radio (NR) communications systems (e.g., at millimeter wave (mm-wave) frequencies) may require signal transmissions and receptions at a user equipment (UE) to share a single antenna or an antenna of an array of antennas, and support multi-band operations (e.g., multiplexing or duplexing). In conventional implementations, off-chip components such as duplexers or circulators are not practical at mm-wave frequencies due to high cost and performance issues. On the other hand, on-chip multiplexing or duplexing schemes may suffer from poor performance such as high loss (e.g., loss >1 dB). Furthermore, some conventional solutions may suffer from high loss for single-band operations, or higher loss to enable multi-band operations. As such, to support different carrier frequency allocations (e.g., at different mm-wave frequencies) and save cost in wireless communications systems (e.g., 5G NR systems), new approaches using low-loss multiplexing (e.g., duplexing) schemes that support multi-band operations may be desirable to improve capability, reliability, and flexibility of wireless communications systems (e.g., 5G NR systems).

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

Several aspects of telecommunication systems will now be presented with reference to various apparatus (e.g., a multiplexer) and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more aspects, the functions described may be implemented in hardware, software, firmware, or any combination thereof. If implemented in software, the functions may be stored on or encoded as one or more instructions or code on a computer-readable medium (e.g., a non-transitory computer-readable medium). Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), and floppy disk where disks usually reproduce data magnetically, while discs reproduce data optically with lasers. Combinations of the above should also be included within the scope of computer-readable media.

Each of the aspects described herein are performed or implemented in connection with FIGS. 1-9, which are described in more detail below.

Referring to FIG. 1, in an aspect, a wireless communication system 100 (e.g., a 5G NR system) includes at least one UE 112 in communication coverage of at least one network entity 120 (e.g., a base station or an eNB, or a cell thereof, in a long term evolution (LTE) or a 5G NR network). The UE 112 may communicate with a network via the network entity 120. In some aspects, multiple UEs including UE 112 may be in communication coverage with one or more network entities, including network entity 120. In an aspect, the network entity 120 may be a base station such an eNode B/eNB in a 5G NR network, and/or in an LTE network. Although various aspects are described in relation to the Universal Mobile Telecommunications System (UMTS), LTE, or 5G NR networks, similar principles may be applied in other wireless wide area networks (WWAN). The wireless network may employ a scheme where multiple base stations may transmit on a channel. In an example, the UE 112 may transmit and/or receive wireless communications to and/or from the network entity 120. For example, the UE 112 may be actively communicating with the network entity 120.

In some aspects, the UE 112 may also be referred to by those skilled in the art (as well as interchangeably herein) as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology. A UE 112 may be a cellular phone, a personal digital assistant (PDA), a wireless modem, a wireless communication device, a handheld device, a tablet computer, a laptop computer, a cordless phone, a wireless local loop (WLL) station, a global positioning system (GPS) device, a multimedia device, a video device, a digital audio player (e.g., MP3 player), a camera, a game console, a wearable computing device (e.g., a smart-watch, smart-glasses, a health or fitness tracker, etc.), an appliance, a sensor, a vehicle communication system, a medical device, a vending machine, a device for the Internet-of-Things, or any other similar functioning device.

Additionally, the network entity 120 may be a macrocell, picocell, femtocell, relay, Node B, mobile Node B, eNB, gNB, small cell box, UE (e.g., communicating in peer-to-peer or ad-hoc mode with the UE 112), or substantially any type of component that can communicate with UE 112 to provide wireless network access at the UE 112.

According to the present aspects, the UE 112 may include one or more processors 140 (including a modem 108), a memory 130, and/or other components that may operate in combination with a radio frequency (RF) front end 104 (including a multi-band multiplexer 114) for performing multi-band operations as described herein.

In an aspect, the term "component" or "elements" as used herein may be one of the parts that make up a system, may be hardware, firmware, and/or software, and may be divided into other components. The multi-band multiplexer 114 may be communicatively coupled with a transceiver 106, which may include a receiver 122 for receiving and processing RF signals and a transmitter 124 for processing and transmitting RF signals. The processor 140 may be coupled to the transceiver 106 and memory 130 via at least one bus 110.

The receiver 122 may include hardware, firmware, and/or software code executable by a processor for receiving data, the code comprising instructions and being stored in a memory (e.g., computer-readable medium). The receiver 122 may be, for example, a radio frequency (RF) receiver. In an aspect, the receiver 122 may receive signals transmitted by network entity 120. The receiver 122 may obtain measurements of the signals. For example, the receiver 122 may determine Ec/Io, signal-to-noise ratio (SNR), etc.

The transmitter 124 may include hardware, firmware, and/or software code executable by a processor for transmitting data, the code comprising instructions and being stored in a memory (e.g., computer-readable medium). The transmitter 124 may be, for example, a RF transmitter.

In an aspect, the one or more processors 140 can include a modem 108 that uses one or more modem processors. The various functions related to multi-band operations (e.g., multiplexing) may be included in modem 108 and/or processors 140 and, in an aspect, can be executed by a single processor, while in other aspects, different ones of the functions may be executed by a combination of two or more different processors. For example, in an aspect, the one or more processors 140 may include any one or any combination of a modem processor, or a baseband processor, or a digital signal processor, or a transmit processor, or a transceiver processor associated with transceiver 106. In particular, for example, the one or more processors 140 may implement components included in the RF front end 104, including the multi-band multiplexer 114.

Moreover, in an aspect, the UE 112 may include an RF front end 104 and a transceiver 106 for receiving and transmitting radio transmissions, for example, wireless communications 126. For example, the transceiver 106 may transmit or receive a signal that includes a pilot signal (e.g., common pilot channel (CPICH)). The transceiver 106 may measure the received pilot signal to determine signal quality and for providing feedback to the network entity 120. In some examples, the transceiver 106 may be communicatively coupled with a single antenna (e.g., antenna 102), or multiple antennas (e.g., one or more antennas 102) simultaneously. For example, the RF front end 104 may be communicatively coupled with multiple antennas 102, where signals may be combined and sent to the transceiver 106. In some cases, the RF front end 104 and the transceiver 106 may be on a same chip or implemented separately (e.g., not on a same chip).

The RF front end 104 may be connected to a single antenna 102 or at least one antenna 102 that is part of an array of antennas (or multiple antennas which is not shown), and may include a multi-band multiplexer 114, one or more low-noise amplifiers (LNAs) 116, one or more power amplifiers (PAs) 118, one or more switches (not shown), and one or more filters (not shown) for transmitting and receiving RF signals. In an aspect, the components of RF front end 104 may be communicatively coupled with the transceiver 106 (e.g., a beamforming transceiver, or a transceiver requires multiple antennas for transmissions/receptions). The transceiver 106 may be communicatively coupled with one or more processors 140 and modem 108.

In some aspects, one or more chips may be used according to one or more of the presently described aspects, and each chip may include a transceiver (e.g., the transceiver 106), a transmitter (e.g., the transmitter 124), and/or a receiver (e.g., the receiver 122).

The multi-band multiplexer 114 may include hardware, firmware, and/or software code executable by a processor for performing multi-band operations. For example, the hardware may include, for example, a hardware accelerator, or specialized processor. In an aspect, the multi-band multiplexer 114 may be configured to perform multiplexing or duplexing of wireless signals transmitted to and/or received from at least the antenna 102. In an aspect, the multi-band multiplexer 114 may be configured or tuned to operate at one or more specified frequencies such that the UE 112 may communicate with, for example, the network entity 120 or other network entities. In an aspect, for example, the modem 108 may configure the multi-band multiplexer 114 to operate at a specified frequency based on the UE configuration of the UE 112 and/or communication protocol(s) used by the modem 108. In some examples, the multi-band multiplexer 114 may be communicatively coupled with at least one antenna, an RF module, an RF cable, or any component discussed herein.

In an aspect, the LNA 116 may amplify a received signal at a desired output level. In an aspect, each LNA 116 may have a specified minimum and maximum gain values. In an aspect, the RF front end 104 may use the multi-band multiplexer 114, and/or one or more switches to select a particular LNA 116 and/or its specified gain value based on a desired gain value for a particular application. In another aspect, the RF front end 104 may use the multi-band multiplexer 114, and/or one or more switches to select a particular LNA 116 with a specified frequency band based on a desired frequency band of a network (e.g., a carrier network) or a frequency band of the network entity 120.

Further, for example, one or more PA(s) 118 may be used by the RF front end 104 to amplify a signal for an RF output at a desired output power level and/or a desired frequency band. In an aspect, each PA 118 may have a specified minimum and maximum gain values. In an aspect, the RF front end 104 may use the multi-band multiplexer 114, and/or one or more switches to select a particular PA 118 and/or a specified gain value for the RF front end 104 or the particular PA 118 based on a desired gain value for a particular application. In another aspect, the RF front end 104 may use the multi-band multiplexer 114, and/or one or more switches to select a particular PA 118 with a specified frequency band based on a desired frequency band of a network (e.g., a carrier network) or a frequency band of the network entity 120.

The multi-band multiplexer 114 may be used by the UE 112 to route a received signal from the antenna 102 to a particular LNA 116. Similarly, in an aspect, for example, the multi-band multiplexer 114 may be used by the UE 112 to route an output from a respective PA 118 to produce an output signal to the antenna 102 for transmission. In an aspect, the multi-band multiplexer 114 may be connected to one or more LNAs 116 and/or one or more PAs 118. In an aspect, the RF front end 104 can use the multi-band multiplexer 114 to select a transmit or receive path using a specified LNA 116, and/or PA 118, based on a configuration as specified by the transceiver 106, one or more processors 140, and/or modem 108.

The transceiver 106 may be configured to transmit and receive wireless signals through the antenna 102 via the RF front end 104. In an aspect, the transceiver 106 may be tuned to operate at one or more specified frequencies such that the UE 112 can communicate with, for example, a network entity 120. In an aspect, for example, the modem 108 can configure the transceiver 106 to operate at a specified frequency and power level based on the UE configuration of the UE 112 and communication protocol used by the modem 108.

In an aspect, the modem 108 can be a multiband-multimode modem, which can process digital data and communicate with the transceiver 106 such that the digital data is sent and received using the transceiver 106. In an aspect, the modem 108 can be multiband and be configured to support multiple frequency bands for a specific communications protocol. In an aspect, the modem 108 can be multimode and be configured to support multiple operating networks and communications protocols. In an aspect, the modem 108 can control one or more components of the UE 112 (e.g., RF front end 104, multi-band multiplexer 114, transceiver 106) to enable transmission and/or reception of signals based on a specified modem configuration. In an aspect, the modem configuration can be based on the mode of the modem and the frequency band in use. In another aspect, the modem configuration can be based on UE configuration information associated with the UE 112 as provided by the network, e.g., during cell selection and/or cell reselection.

The UE 112 may further include memory 130, such as for storing data used herein and/or local versions of applications or multi-band multiplexer 114 being executed by the processor 140. The memory 130 can include any type of computer-readable medium usable by a computer or processor 140, such as random access memory (RAM), read only memory (ROM), tapes, magnetic discs, optical discs, volatile memory, non-volatile memory, and any combination thereof. In an aspect, for example, the memory 130 may be a computer-readable storage medium that stores one or more computer-executable codes defining or operating the multi-band multiplexer 114, and/or data associated therewith, when the UE 112 is operating the processor 140 to execute the multi-band multiplexer 114 or other related components. In another aspect, for example, the memory 130 may be a non-transitory computer-readable storage medium.

The wireless communications network 100 may further include base stations (e.g., network entity 120) operating according to Wi-Fi technology, e.g., Wi-Fi access points (AP), in communication with UEs (e.g., UE 112) operating according to Wi-Fi technology, e.g., Wi-Fi stations (STAs) via communication links in an unlicensed frequency spectrum (e.g., 5 GHz). When communicating in an unlicensed frequency spectrum, the STAs and AP may perform a clear channel assessment (CCA) or listen before talk (LBT) procedure prior to communicating in order to determine whether the channel is available.

Additionally, the network entity 120 and/or the UE 112 may operate according to a 5G NR technology referred to as millimeter wave (mm-W or mm-wave) technology. For example, mm-wave technology includes transmissions in mm-wave frequencies and/or near mm-wave frequencies. Extremely high frequency (EHF) is part of the radio frequency (RF) in the electromagnetic spectrum. EHF has a range of 30 GHz to 300 GHz (e.g., 39 GHz) and a wavelength between 1 millimeter and 10 millimeters. Radio waves in this band may be referred to as a millimeter wave. Near mm-wave may extend down to a frequency of 3 GHz with a wavelength of 100 millimeters. For example, the super high frequency (SHF) band extends between 3 GHz and 30 GHz (e.g., 28 GHz), and may also be referred to as centimeter wave. Communications using the mm-wave and/or near mm-wave radio frequency band may have extremely high path loss and a short range. As such, the network entity 120 and/or the UE 112 operating according to the mm-wave technology may utilize beamforming in their transmissions to compensate for the extremely high path loss and short range.

In some aspects, wireless communications systems (e.g., a 5G NR system) may be time-division duplexing (TDD) based and operate at mm-wave radio frequencies. In an example, the receiver (e.g., receiver 122 in FIG. 1) and/or transmitter (e.g., transmitter 124 in FIG. 1) of a UE (e.g., UE 112 in FIG. 1) may operate at a same frequency band, or at one or more predetermined frequency bands, and may feed a single antenna (e.g., antenna 102 in FIG. 1). In this case, the UE (e.g., UE 112 in FIG. 1) may need to combine the signal transmissions and receptions to feed the antenna.

In some conventional implementations in wireless communications systems (e.g., in a 5G NR system) off-chip duplexers, circulators, and/or some other off-chip components may not be practical at millimeter-wave radio frequencies, and may not be cost-efficient because each antenna element may require at least a set of off-chip components. In an example, if a UE has eight to sixteen or more antenna elements, the UE may require eight to sixteen or more sets of off-chip components. Furthermore, a practical wireless communications systems (e.g., a 5G NR system) may require supports for multi-band operations from a single antenna in order to support different carrier frequency allocations. However, conventional solutions (e.g., for mm-wave or Wi-Fi systems) may suffer from high loss for single-band operation, or higher loss to enable multi-band operations.

Figure 2:
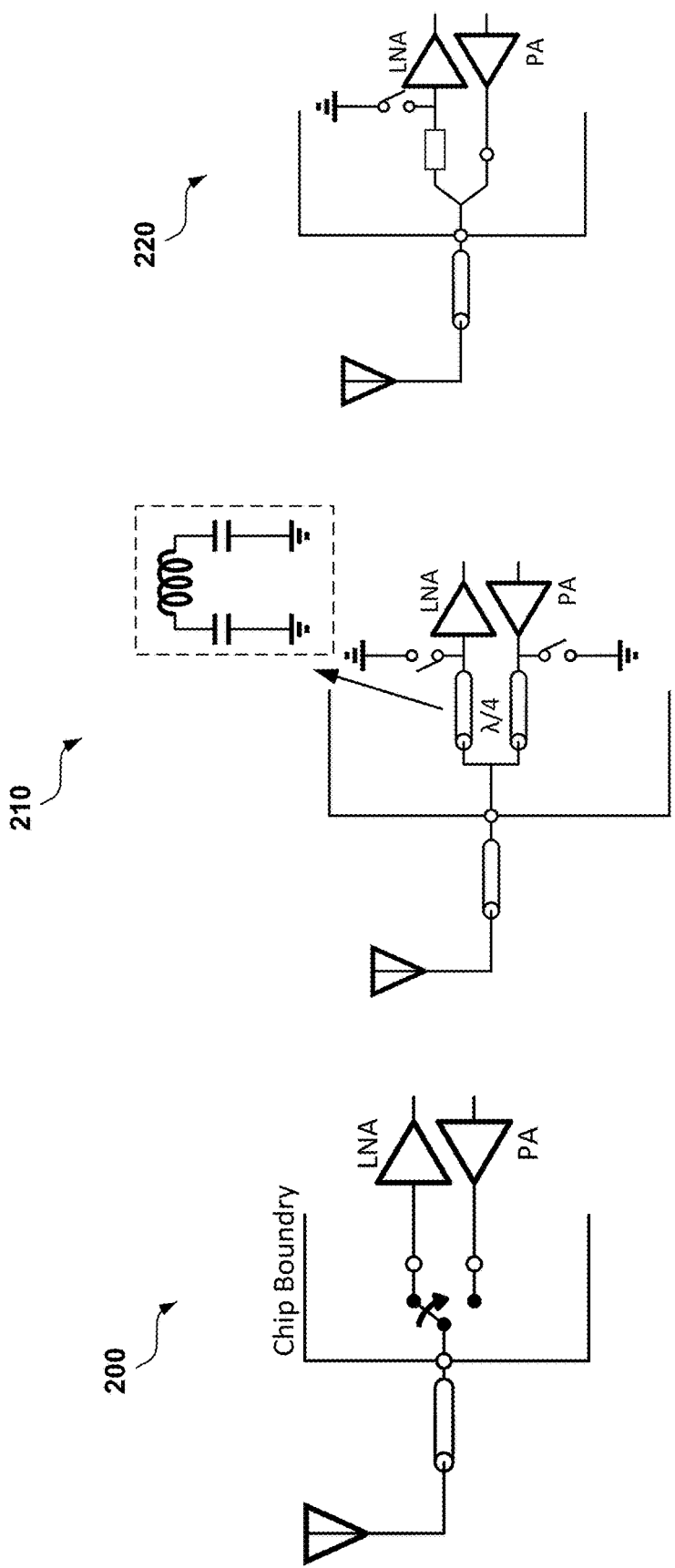
FIG. 2 is a schematic diagram of three prior art conventional implementations of radio frequency front end designs.

Referring to FIG. 2, in a conventional implementation, an RF front end design 200 may implement a switch used for selecting an LNA or a PA. In an aspect, the RF front end design 200 may operate at more than one frequency band, however, the loss of this RF front end design may be very high, e.g., 1 dB to 2 dB at least. In another conventional implementation, an RF front end design 210 may implement shunt-based switches, however, the implementation of the RF front end design 210 may result in high loss (e.g., 1 dB or more) when using one or more on-chip combining components. In addition, the RF front end design 210 may only operate at narrow-band frequencies and may require a large on-chip area for circuits and/or components. In another example, an RF front end design 220 may include a switch on one side (e.g., at the receiving side with an LNA), and may significantly sacrifice the other side (e.g., no switch at the transmitting side with a PA). In other words, for system reliability, the RF front end design 220 may only have a switch on an LNA but no switch on a PA. In this design 220, the PA may parasitically affect the LNA and vice-versa, and experience high loss (e.g., 1 dB loss or higher).

Figure 3:
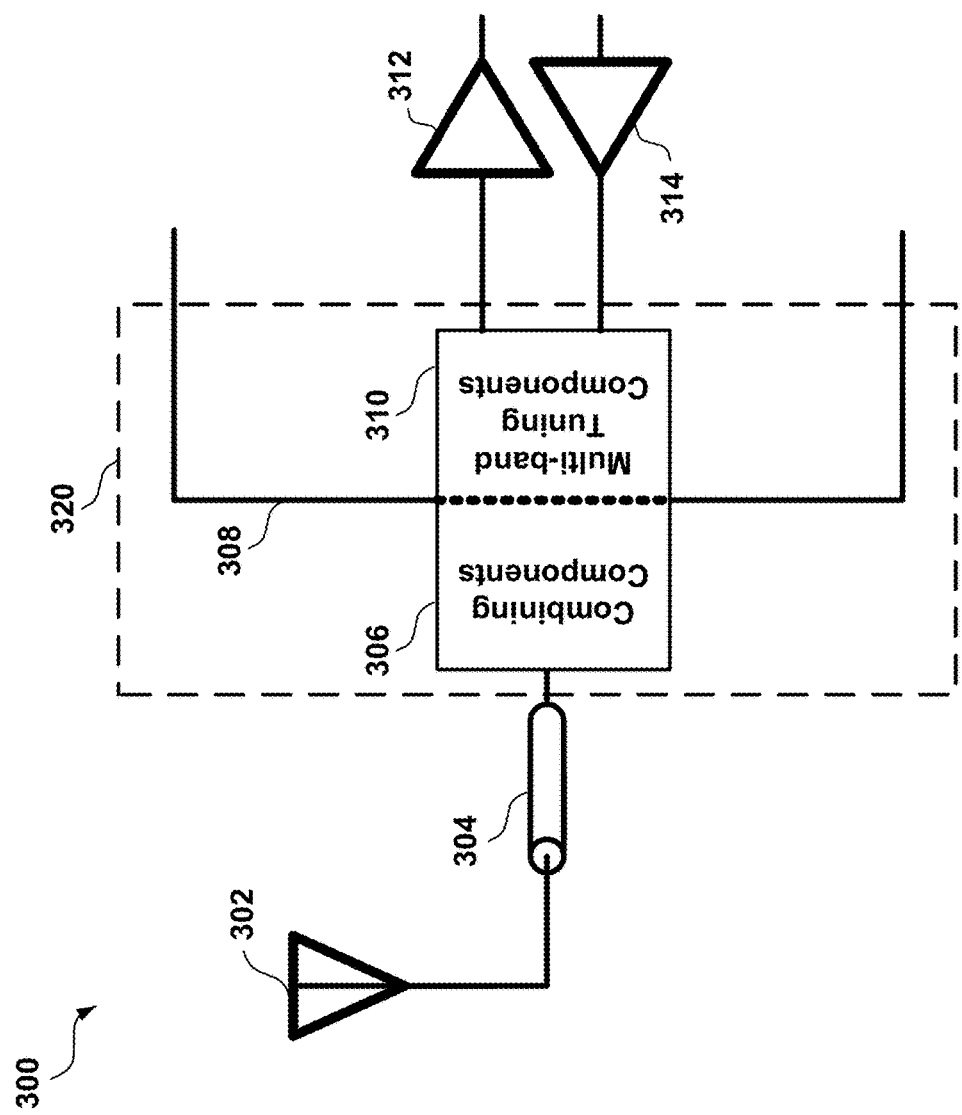
FIG. 3 is a schematic diagram of an example of a multi-band multiplexer for a radio frequency front end, according to one or more of the presently described aspects.

Referring to FIG. 3, in an aspect of the present disclosure, a low-loss multi-band multiplexing (e.g., duplexing) scheme 300 is proposed to support multiple mm-wave frequencies (e.g., 28 GHz and 39 GHz). In an example, a single multiplexer 320 (e.g., the multi-band multiplexer 114 in FIG. 1) using the multiplexing scheme 300 may support multiple mm-wave frequency bands, and the multiplexer 320 may be frequency tunable. In some examples, the multiplexer 320 may be communicatively coupled with one or more antennas 302, and/or one or more RF components 304 (e.g., an inductor, a capacitor, or a resistor), and may be communicatively coupled with one or more amplifiers 312 and 314. In particular, in an aspect, the multiplexer 320 (e.g., a duplexer, or the multi-band multiplexer 114 in FIG. 1) may include one or more combining components 306 and one or more multi-band tuning components 310, and may be separated by a chip boundary 308. The one or more combining components 306 may be off-chip components (or elements) and may be configured to transmit and receive multiplexed signals or waveforms and may be communicatively coupled with the one or more multi-band tuning components 310 to perform signal transition(s) from off-chip to on-chip, or from on-chip to off-chip, enabling low-loss operations. The one or more multi-band tuning components 310 may be on-chip components (or elements) (e.g., components on a chip, such as an integrated circuit (IC) chip or a silicon chip) and may include one or more shunt-based switches, enabling multi-band operations. In some cases, the terms "components" and "elements" discussed here may be interchanged.

In some examples, the off-chip components discussed herein (e.g., the combining components 306) may be one or more components that are not fabricated or integrated on the chip (e.g., an IC chip or a silicon chip) used for the on-chip components (e.g., the multi-band tuning components 310). For example, the off-chip components may be fabricated or integrated on a module substrate, a printed circuit board (PCB), or a chip different from the chip used for the on-chip components. In an aspect, impedance transformation circuits may be implemented off-chip and include the chip or signal transition(s), enabling low-loss switching or selection. Therefore, both low-loss and multi-band operations may be supported. In some examples, the proposed low-loss multi-band multiplexing (e.g., duplexing) scheme(s) may provide significant improvements in loss over conventional designs, may relax constraints on PA (e.g., wideband amplifier 314) and/or LNA (e.g., wideband amplifier 312) designs, and may reduce overall power consumption of a UE.

Figure 4:
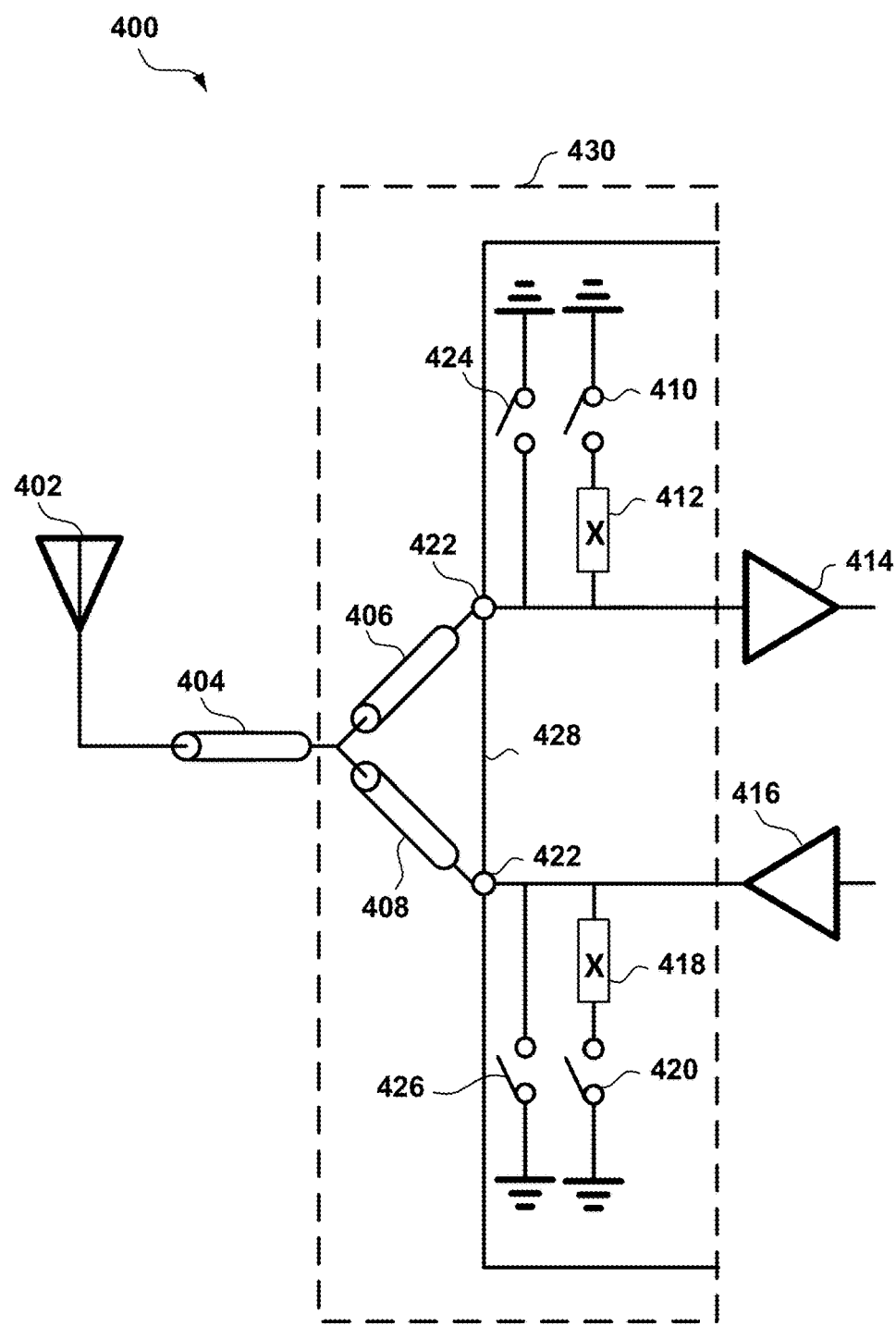
FIG. 4 is a schematic diagram of an example of a multi-band multiplexer configured to perform multi-band operations using single-pole double-throw (SPDT) switches, according to one or more of the presently described aspects.

Referring to FIG. 4, in an aspect of the present disclosure, a low-loss multi-band multiplexing (e.g., duplexing) scheme 400 to support multiple mm-wave frequencies (e.g., 28 GHz and 39 GHz) is illustrated in more detail. In some examples, the multiplexing scheme 400 may be a TDD-based scheme without frequency filtering, and may support wideband operations that match predetermined high frequency bands. In an example, a single multiplexer 430 (e.g., the multi-band multiplexer 114 in FIG. 1) using the multiplexing scheme 400 may support multiple mm-wave frequency bands, and the single multiplexer may be frequency tunable.

In particular, in an aspect, a UE (e.g., UE 112 in FIG. 1) may include an RF front end (e.g., RF front end 104 in FIG. 1) which may include the multiplexer 430 (e.g., a duplexer, or the multi-band multiplexer 114 in FIG. 1), and the RF front end may be communicatively coupled with one or more antennas 402. In an example, each antenna may be communicatively coupled with a respective set of combining components. In another example, multiple antennas may be communicatively coupled with a switch or a module, and may share a set of combining components.

Figure 5:
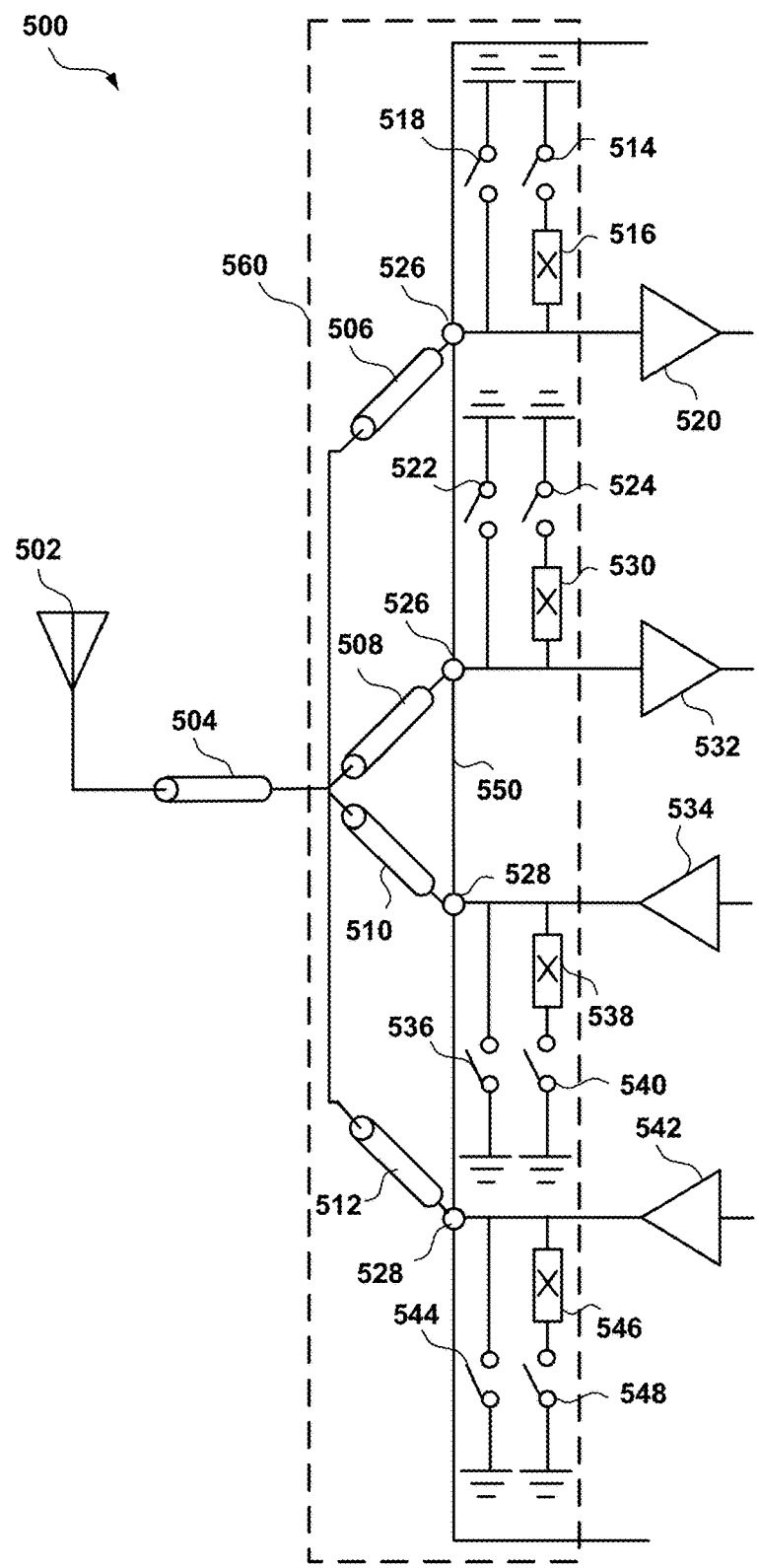
FIG. 5 is a schematic diagram of an example of a multi-band multiplexer configured to perform multi-band operations using single-pole N-throw (SPNT) switches, according to one or more of the presently described aspects.

In an aspect, the multiplexer 430 may include off-chip components (e.g., 406 and 408) and on-chip components (e.g., 410, 412, 418, 420, 424, and 426), and the off-chip components and the on-chip components may be separated by a chip boundary 428. In an example, the multiplexer 430 may be communicatively coupled with one or more off-chip RF components 404 (e.g., an inductor, or a resistor), and may be communicatively coupled with one or more wideband amplifiers 414 (e.g., an LNA) or 416 (e.g., a PA). In an implementation, the off-chip components may be communicatively coupled with or connected to the on-chip components through chip soldering at one or more connections 422. In an example, the multiplexer 430 may be a low-loss duplexer having one or more single-pole double-throw (SPDT) switches, or a low-loss multiplexer having one or more single-pole N-throw (SPNT) switches, where N=2, 4, 8, etc. In some cases, the SPDT or SPNT switches may include on-chip switches (e.g., switches 410, 424, 420, and 426), and may be used for switching between transmission and reception, and/or between different frequency bands, or may be used for selecting or adjusting to a predetermined frequency band. For example, the multiplexer may be configured or reconfigured for multi-band operations. In an example, when N=4, the low-loss multiplexer may use multiple single-pole 4-throw (SP4T) switches, and may be configured to perform four-way multiplexing (an example is shown in FIG. 5). In an aspect, the SPDT or SPNT switches may be shunt-based switches, with same or different logic (e.g., low/high, or on/off) that may be digital. In some examples, the tuning components may include shunt-based switches (e.g., 410, 424, 420, and 426) and band-select components (e.g., 412 and 418), and may be integrated on-chip and incorporated into matching networks or circuits of the wideband amplifiers (e.g., 414 and/or 416) to enable multi-band operations. In an aspect, a band-select component (e.g., 412 or 418) may be a fixed or tunable reactance, inductor, capacitor, and/or resistor. In an aspect, the wideband amplifiers may include one or more LNAs (e.g., 414), and/or one or more PAs (e.g., 416).

In an aspect, combining components (e.g., off-chip combining components 406 and 408) may include impedance transformation circuits on at least a module substrate or a printed circuit board (PCB), and may be used for transmission/reception line combining or splitting (e.g., TDD-based combining or splitting). In some examples, these impedance transformation circuits may be implemented on the module substrate or PCB as transmission/reception lines or signal paths, and incorporate the chip transition to enable low-loss characteristic for low-loss switching. For example, implementing one or more off-chip impedance transformation circuits may realize low-loss characteristic for the multiplexing scheme 400 because module or PCB level routing may exhibit much lower loss than on-chip routing due to larger line widths and thicknesses, as well as higher quality dielectric material(s). In addition, routing on the module may avoid unnecessary discontinuities (e.g., turns or bends) which may contribute to additional loss. Therefore, the multiplexing scheme 400 is a hybrid approach using both on-chip and off-chip components to enable low-loss and low-cost operations.

Still referring to FIG. 4, in an aspect, at a high level, the multiplexer or duplexer used in multiplexing scheme 400 may function similar to a shunt SPDT switch. For example, a short circuit on one side is transformed into an open circuit at the common junction through the effective length (e.g., electrical length) of the combining network/circuit. The off-chip combining networks or components may be configured to transform the impedances of a non-operational signal path to present a desirable load (e.g. an open circuit) to an operational signal path. In some examples, an open circuit may be the ideal impedance loading of an operational path. In some cases, a circuit design may target some reactive load rather than a pure open circuit to help with impedance matching. Additionally, each combining element may have an associated set of on-chip shunt-based switches (e.g., 410 and 424, or 420 and 426) and one or more band-select components (e.g., 412 and/or 418). In an aspect, the band-select components may include one or more tunable reactances that may be configured to adjust the effective length of one or more individual legs of a combining circuit network or the multiplexer, enabling the shunt-based switches to operate effectively over many different frequency bands. Therefore, the hybrid approach using both on-chip and off-chip components enables multi-band operations.

Referring to FIG. 5, in another aspect of the present disclosure, a low-loss multi-band multiplexing (e.g., four-way multiplexing) scheme 500 to simultaneously support multiple mm-wave frequencies (e.g., four frequency bands) is provided. Similar to multiplexing scheme 400, a UE (e.g., UE 112 in FIG. 1) using the multiplexing scheme 500 may include an RF front end (e.g., RF front end 104 in FIG. 1) which may include a multiplexer 560 (e.g., a multi-band multiplexer 114 in FIG. 1), and the RF front end may be communicatively coupled with at least one antenna 502. In an aspect, the multiplexer 560 may be communicatively coupled with one or more off-chip RF components 504 (e.g., an inductor, a capacitor, or a resistor), and may be configured to perform multi-band operations using one or more single-pole 4-throw (SP4T) switches. In some examples, switches 514, 518, 522, and 524 may be configured as a first SP4T, and switches 536, 540, 544, and 548 may be configured as a second SP4T. In an implementation, for example, the first SP4T may be configured by a controller or processor to set one of the four switches (e.g., the switch 514) to be closed (or "ON"), and to set the other three switches (e.g., the switches 518, 522, and 524) to be open (or "OFF"). In another example, the second SP4T may be configured by a controller or processor to set one of the four switches (e.g., the switch 536) to be closed (or "ON"), and to set the other three switches (e.g., the switches 540, 544, and 548) to be open (or "OFF"). In some cases, the first SP4T or second SP4T may be controlled by a controller or processor using logic or gate information (e.g., "1"/"0", low/high, or on/off).

In an aspect, two, four, or more off-chip combining components (e.g., 506, 508, 510, or 512) may be used to separate or combine multiple (e.g., two, four, or more) signal paths. In the multiplexing scheme 500, for example, four combining components (e.g., 506, 508, 510, and 512) may be used to separate, route, or combine four signal paths. In an implementation, the off-chip components may be communicatively coupled with or connected to the on-chip components through chip soldering at one or more connections 526 and/or 528. In an aspect, the off-chip components and the on-chip components may be separated by a chip boundary 550.

In an example, using the multiplexing scheme 500, the multiplexer 560 may be communicatively coupled with multiple amplifiers that may be wideband amplifiers (e.g., LNAs 520, 532, and/or PAs 534, 542) or multiple single-band amplifiers (e.g., LNAs 520, 532, and/or PAs 534, 542). In an aspect, the on-chip tuning components may include multiple shunt-based switches (e.g., 514, 518, 522, 524, 536, 540, 544, and/or 548) and multiple band-select components (e.g., 516, 530, 538, and/or 546), and may be integrated on-chip and incorporated into matching networks or circuits of the amplifiers (e.g., LNAs 520, 532, and/or PAs 534, 542) to enable multi-band operations. In an aspect, a band-select component (e.g., 516, 530, 538, and/or 546) may be a fixed or tunable reactance, inductor, capacitor, and/or resistor.

Figure 6A:
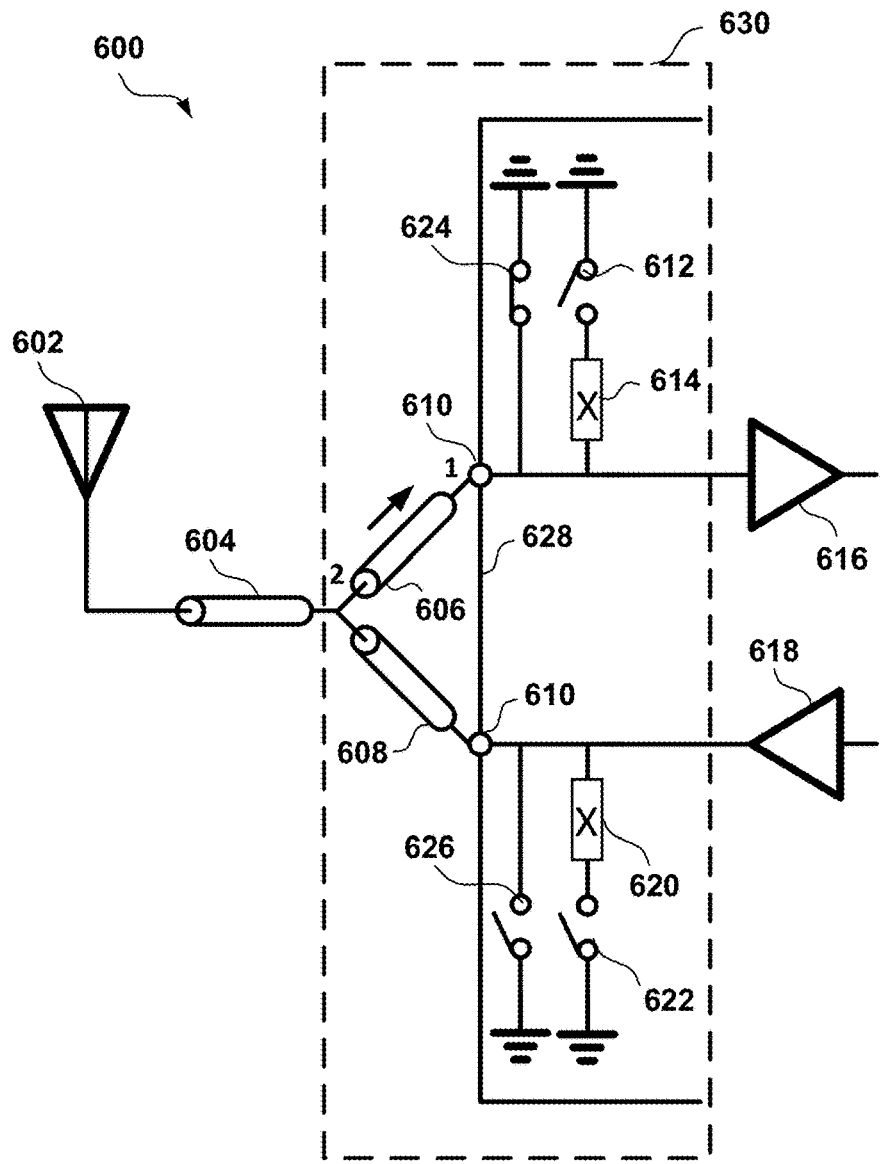
FIG. 6A is a schematic diagram of an example of a multi-band multiplexer configured to use SPDT switches to transmit or receive signals within a first frequency band, according to one or more of the presently described aspects.

Referring to FIG. 6A, in an aspect, a multiplexer (e.g., multi-band multiplexer 114 in FIG. 1) may be configured to perform a multi-band operation using multiplexing scheme 600. In particular, similar to multiplexing scheme 400, a UE (e.g., UE 112 in FIG. 1) may include an RF front end (e.g., RF front end 104 in FIG. 1) which may include a multiplexer 630, and the RF front end may be communicatively coupled with at least one antenna 602. In an aspect, the multiplexer 630 may include off-chip components (e.g., 606 and 608)

and on-chip components (e.g., 612, 614, 620, 622, 624, and 626). In an example, the multiplexer 630 may be communicatively coupled with one or more off-chip RF components 604 (e.g., an inductor, a capacitor, or a resistor), and may be communicatively coupled with wideband amplifiers 616 (e.g., an LNA) and 618 (e.g., a PA). In an implementation, the off-chip components may be communicatively coupled with or connected to the on-chip components through chip soldering at one or more connections 610. In an aspect, the off-chip components and the on-chip components may be separated by a chip boundary 628.

In an aspect, the combining components (e.g., off-chip combining components 606 and 608) of the multiplexer 630 may include impedance transformation circuits on at least a module substrate or a PCB, and may be used for transmission/reception line combining or splitting (e.g., TDD-based combining or splitting). In some implementations, the combining components 606 and 608 can be used as part of the routing to the antenna (i.e. reduce length and loss of element 604). In an example, the multiplexer 630 may be a low-loss duplexer having one or more on-chip SPDT switches, and may be used for switching between signal transmission and reception, and/or between different frequency bands. In some examples, the tuning components (e.g., switches 612, 624, 622, and 626) may be formed or configured to perform as one or more on-chip SPDT switches (shunt-based switches). Additionally, the tuning components may include one or more band-select components (e.g., 614 or 620), and may be integrated on-chip and incorporated into matching networks or circuits of the wideband amplifiers (e.g., 616 and/or 618) to enable multi-band operations. In an aspect, the one or more band-select components (e.g., 614 or 620) may include a fixed or tunable reactance, an inductor, a capacitor, a resistor, or any combination of these components. In an aspect, the wideband amplifiers may include at least the LNA 616 and PA 618.

In an example, the multiplexer 630 may be configured to use the multiplexing scheme 600 (e.g., via one or more SPDT switches) in a 28 GHz mode (or around 30 GHz). In an aspect, switches 612, 624, 626, and 622 may logically form a SPDT switch to control signals. For example, logic for switches 612 and 624 may be complementary to switches 626 and 622 with respect to transmission or reception operations (e.g., "1"/"0", high/low, or on/off). In an aspect, logic for switches 624 and 626 may be complementary to switches 612 and 622 with respect to band selection(s) (e.g., "1"/"0", high/low, or on/off). In an example, by closing the switch 624 and opening switches 612, 622, and 626, a short circuit on the LNA 616 side is transformed into a high impedance at the common junction of the off-chip components 606 and 608 (or point 2 in FIG. 6A), where the PA 618 is configured to be on, and the LNA 616 is configured to be off. As shown in the table in FIG. 6A, in an example of a 28 GHz mode configuration, the impedance transformation circuits may be configured to transform impedances of a non-operational signal path of the multiplexer 630 to present a load to an operational signal path of the multiplexer 630. For example, the input impedance (Zin) toward LNA 616 at point 1 (or chip soldering connection 610) may be low (e.g., a short circuit) for both a 28 GHz path and a 39 GHz path. At point 2 (the common junction of the off-chip components 606 and 608), Zin is high for the 28 GHz path (e.g., an open circuit), and for the 39 GHz path, Zin may be transformed to another impedance based on the off-chip component 606. For example, if the off-chip component 606 is a transmission line sized to transform a short circuit to an open circuit at 28 GHz, then Zin would be capacitive at 39 GHz.

Figure 6B:
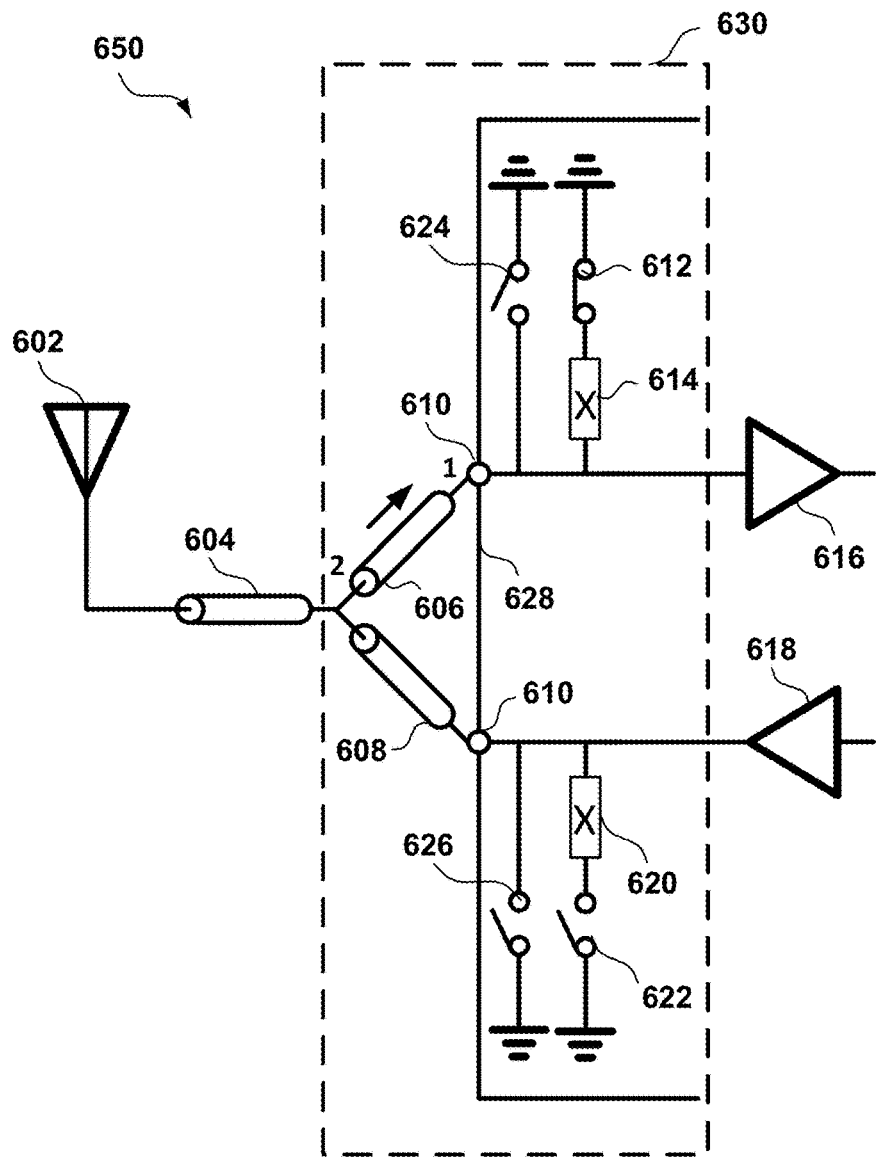
FIG. 6B is a schematic diagram of an example of a multi-band multiplexer configured to use SPDT switches to transmit or receive signals within a second frequency band, according to one or more of the presently described aspects.

Referring to FIG. 6B, in an aspect, the multiplexer 630 (e.g., multi-band multiplexer 114 in FIG. 1) may be configured to perform a multi-band operation using multiplexing scheme 650. For example, the multiplexer 630 may be configured to use the multiplexing scheme 650 (e.g., via one or more SPDT switches) in a 39 GHz mode (or around 40 GHz). In an aspect, switches 612 and 624 may logically form a SPDT switch to control signals. For example, logic for switches 612 and 624 may be complementary to switches 626 and 622 with respect to transmission or reception operations (e.g., "1"/"0", high/low, or on/off). In an aspect, logic for switches 624 and 626 may be complementary to switches 612 and 622 with respect to band selection(s) (e.g., "1"/"0", high/low, or on/off). In an example, by closing the switch 612 and opening switches 624, 622, and 626, a short circuit with the on-chip component 614 (e.g., a tunable reactance) on the LNA 616 side is transformed into an open circuit at the common junction of the off-chip components 606 and 608 (or point 2), and may be adjusted (e.g., by a controller or a processor) to an effective length (e.g., electrical length) of the individual leg, where the PA 618 is configured to be on, and the LNA 616 is configured to be off. As shown in the table in FIG. 6B, in an example of a 39 GHz mode configuration, the impedance transformation circuits may be configured to transform impedances of a non-operational signal path of the multiplexer 630 to present a load to an operational signal path of the multiplexer 630. For example, the input impedance (Zin) toward LNA 616 at point 1 (or chip soldering connection 610) may be low (e.g., a short circuit) for both a 28 GHz path and a 39 GHz path. At point 2 (the common junction of the off-chip components 606 and 608), Zin is high for the 39 GHz path (e.g., an open circuit), and for the 28 GHz path, Zin may be transformed to another impedance based on the off-chip component 606. In an example, Zin may depend on the off-chip component 606 and/or the on-chip component 614 (e.g., the individual leg of a tunable reactance).

Figure 7:
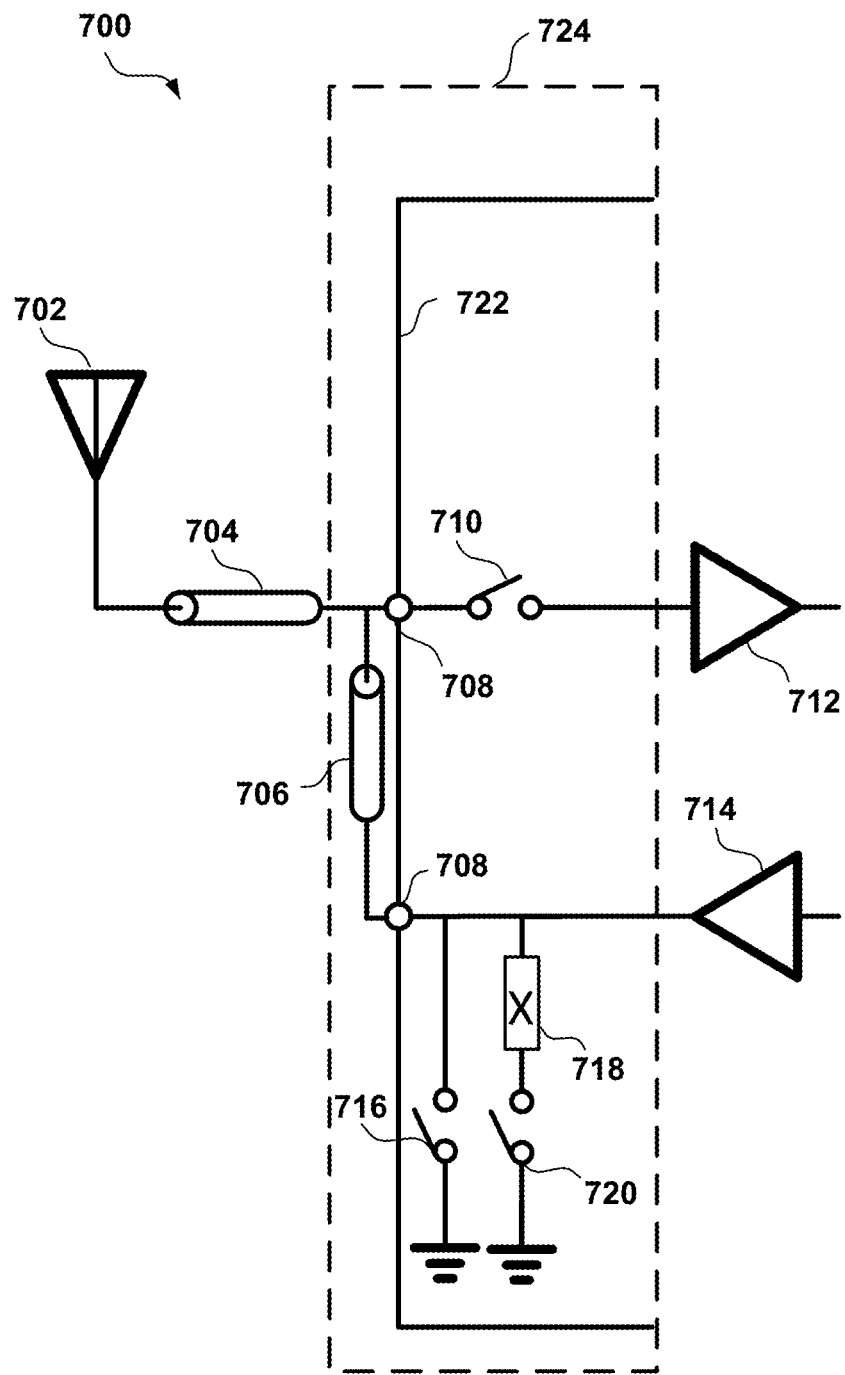
FIG. 7 is a schematic diagram of an example of a multiplexer configured to perform multi-band operations with an asymmetrical design, according to one or more of the presently described aspects.

Referring to FIG. 7, in an aspect, a multiplexer 724 (e.g., multi-band multiplexer 114 in FIG. 1) may be configured to perform a multi-band operation using multiplexing scheme 700. In an example, multiplexing scheme 700 is an asymmetrical design to avoid shunt switches on the LNA side (e.g., an LNA 712). In this asymmetrical implementation, a combining network/component may be simplified and reduced in area, and PA loss performance is maintained at a low level, with some additional loss from the LNA side. As a result, the PA loss performance is maintained at the cost of LNA loss. In this implementation, the total system loss may be reduced, and the RF front end is simplified.

For example, by using multiplexing scheme 700, a UE (e.g., UE 112 in FIG. 1) may include an RF front end (e.g., RF front end 104 in FIG. 1) which may include the multiplexer 724, and the RF front end may be communicatively coupled with at least one antenna 702. In an aspect, the multiplexer 724 may include at least an off-chip component 706 and on-chip components 710, 716, 718, and 720, may be communicatively coupled with one or more off-chip RF components 704 (e.g., an inductor, a capacitor, or a resistor), and may be communicatively coupled with wideband amplifiers 712 (e.g., an LNA) and 714 (e.g., a PA). In an implementation, the off-chip components may be communicatively coupled with or connected to the on-chip components through chip soldering at one or more connections 708. In an aspect, the off-chip components and the on-chip components may be separated by a chip boundary 722.

In an aspect, the off-chip combining component(s) of the multiplexer 724 may include impedance transformation circuits on at least a module substrate or a PCB, and may be used for transmission/reception line combining or splitting (e.g., TDD-based combining or splitting). In an example, the multiplexer 724 may be a low-loss duplexer having one or more on-chip switches (e.g., 710, 716, or 720), and may be used for switching between signal transmission and reception, and/or between different frequency bands. In some examples, the tuning components may include on-chip shunt-based switches 716 and 720 and at least a band-select component 718, and may be integrated on-chip and incorporated into matching network(s) or circuit(s) of at least one of the wideband amplifiers 712 and 714 to enable multi-band operations. In an aspect, switches 716 and 720 may logically form a SPDT switch when controlling signals or logic for switches 716 and 720 are complementary (e.g., "1"/"0", high/low, or on/off). In an aspect, the band-select component 718 may be a fixed or tunable reactance, inductor, capacitor, and/or resistor. In an aspect, the wideband amplifiers may include at least LNA 712 and PA 714.

In some aspects, by using a low-loss multi-band multiplexer, system performance may be improved and the transmission losses (e.g., within a UE) in a particular frequency band may be reduced. In an example, the loss at a PA port may occur when the PA is tuned/switched to 28 GHz band, and the loss at an LNA port may occur when the LNA is tuned/switched to 39 GHz band. In an aspect, the LNA loss may be higher than the PA loss. In an example, the switch(es) on the PA side may introduce more loss than the switch(es) used on the LNA side. In an aspect, on the PA side, the switch(es) may be designed for better reliability rather than less loss. In some examples, the loss of the proposed multiplexing schemes in FIGS. 3-7 is much less than the conventional solutions discussed herein, for example, with more than 1.5 dB less loss at mm-wave frequencies and with SPDT or duplexers quoted. In addition, the proposed multiplexing schemes in FIGS. 3-7 may support multi-band operations.

For purposes of simplicity of explanation, the methods discussed herein are shown and described as a series of acts, it is to be understood and appreciated that the method (and further methods related thereto) is/are not limited by the order of acts, as some acts may, in accordance with one or more aspects, occur in different orders and/or concurrently with other acts from that shown and described herein. For example, it is to be appreciated that a method could alternatively be represented as a series of interrelated states or events, such as in a state diagram. Moreover, not all illustrated acts may be required to implement a method in accordance with one or more features described herein.

Figure 8:
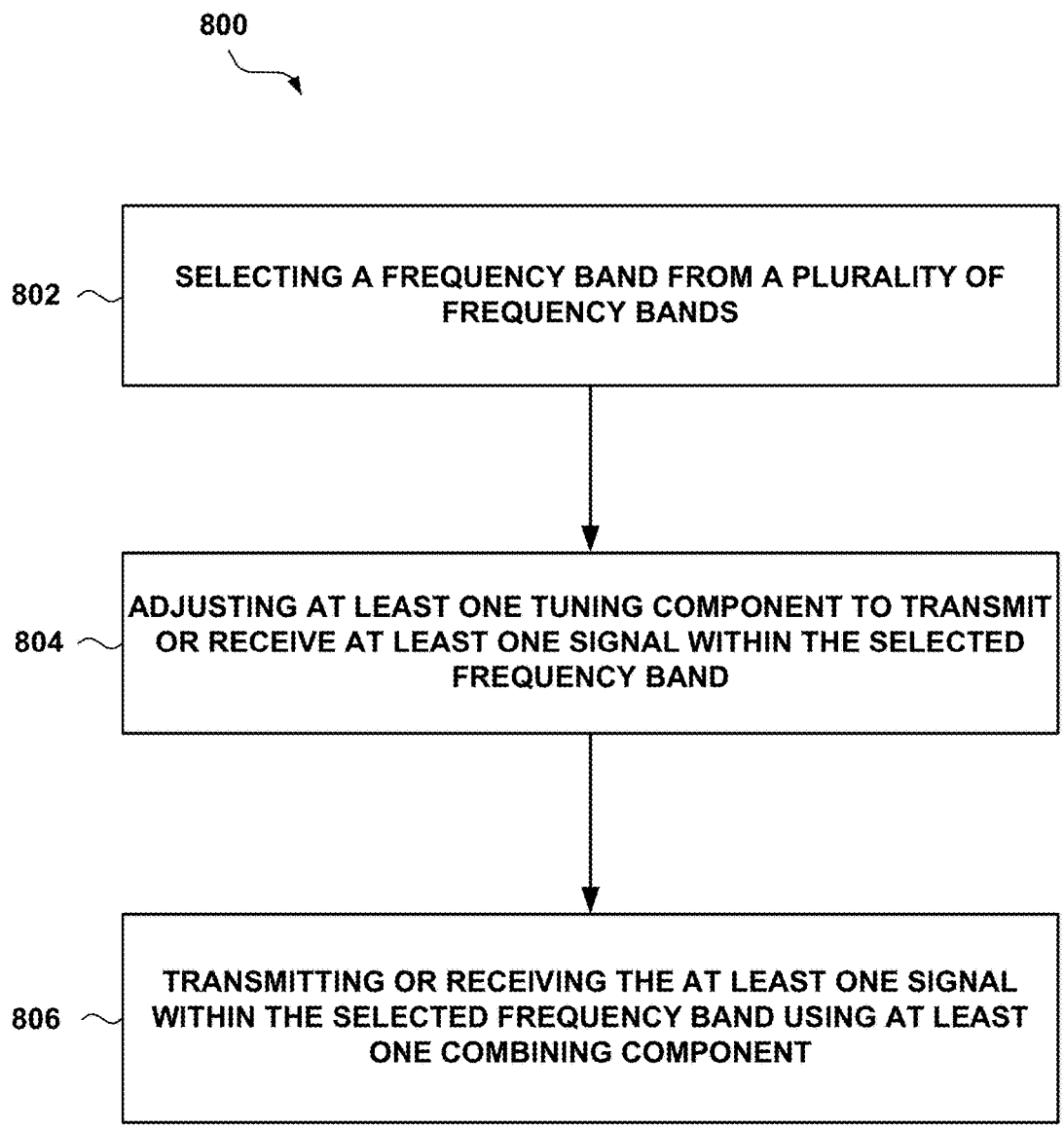
FIG. 8 is a flow diagram of an example method of multi-band operations for wireless communications (e.g., 5G NR), according to one or more of the presently described aspects.

Referring to FIG. 8, in an operational aspect, a UE such as UE 112 (FIG. 1) may perform one or more aspects of a method 800 for multi-band operations in a wireless communications system (e.g., a 5G NR system). For example, one or more of the processors 140, the memory 130, the modem 108, the RF front end 104, and/or the multi-band multiplexer 114, may be configured to perform one or more aspects of the method 800. In an aspect, for example, one or more of the processors 140, the memory 130, and/or the modem 108 may configure the transceiver 106 (e.g., a beamforming transceiver, or a transceiver requires multiple antennas for transmissions/receptions), the RF front end 104, and/or the multi-band multiplexer 114 to perform one or more aspects of the method 800.

In an aspect, at block 802, the method 800 may include selecting a frequency band from a plurality of frequency bands. In an aspect, for example, the multi-band multiplexer 114 may be configured by one or more of the processors 140, the memory 130, and/or the modem 108 to perform frequency band selection as described herein. For example, the multi-band multiplexer 114 may be configured to use at least one of the multiplexing schemes 400, 500, 600, 650, or 700, and select a frequency band from multiple mm-wave frequency bands that are supported by the multi-band multiplexer 114.

In an aspect, at block 804, the method 800 may include adjusting at least one tuning component to transmit or receive at least one signal within the selected frequency band. In an aspect, for example, one or more on-chip tuning components (e.g., on-chip components 310, 410, 412, 418, 420, 424, 426, etc.) of the multi-band multiplexer 114 may be configured by one or more of the processors 140, the memory 130, and/or the modem 108 to tune or adjust (e.g., to adjust on-chip components 410, 412, 418, 420, 424, 426, etc.) in order to transmit or receive signals in a selected or predetermined frequency band (e.g., the frequency band selected or determined at block 802). In an example, the one or more on-chip tuning components of the multi-band multiplexer 114 may comprise at least two shunt-based switches to form an SPDT switch or an SPNT switch, and one or more band-select components (e.g., a tunable reactance) to perform the frequency band adjustment.

In an aspect, at block 806, the method 800 may include transmitting or receiving the at least one signal within the selected frequency band using at least one combining component. In an aspect, for example, one or more combining components (e.g., combining components 306, 406, 408, 506, 508, 510, 512, 606, 608, and/or 706) of the multi-band multiplexer 114 may be communicatively coupled with the at least one tuning component, and configured by one or more of the processors 140, the memory 130, and/or the modem 108 to transmit or receive multiplexed signals within the frequency band that is selected at block 802, as described herein. In some examples, the at least one tuning component may be integrated on a chip (e.g., an IC chip), and the at least one combining component may be off-chip and may not be integrated on the chip having the at least one tuning component. For example, the one or more combining components may be on a module substrate, a PCB, or a chip different from the chip used by the at least one tuning component.

Figure 9:
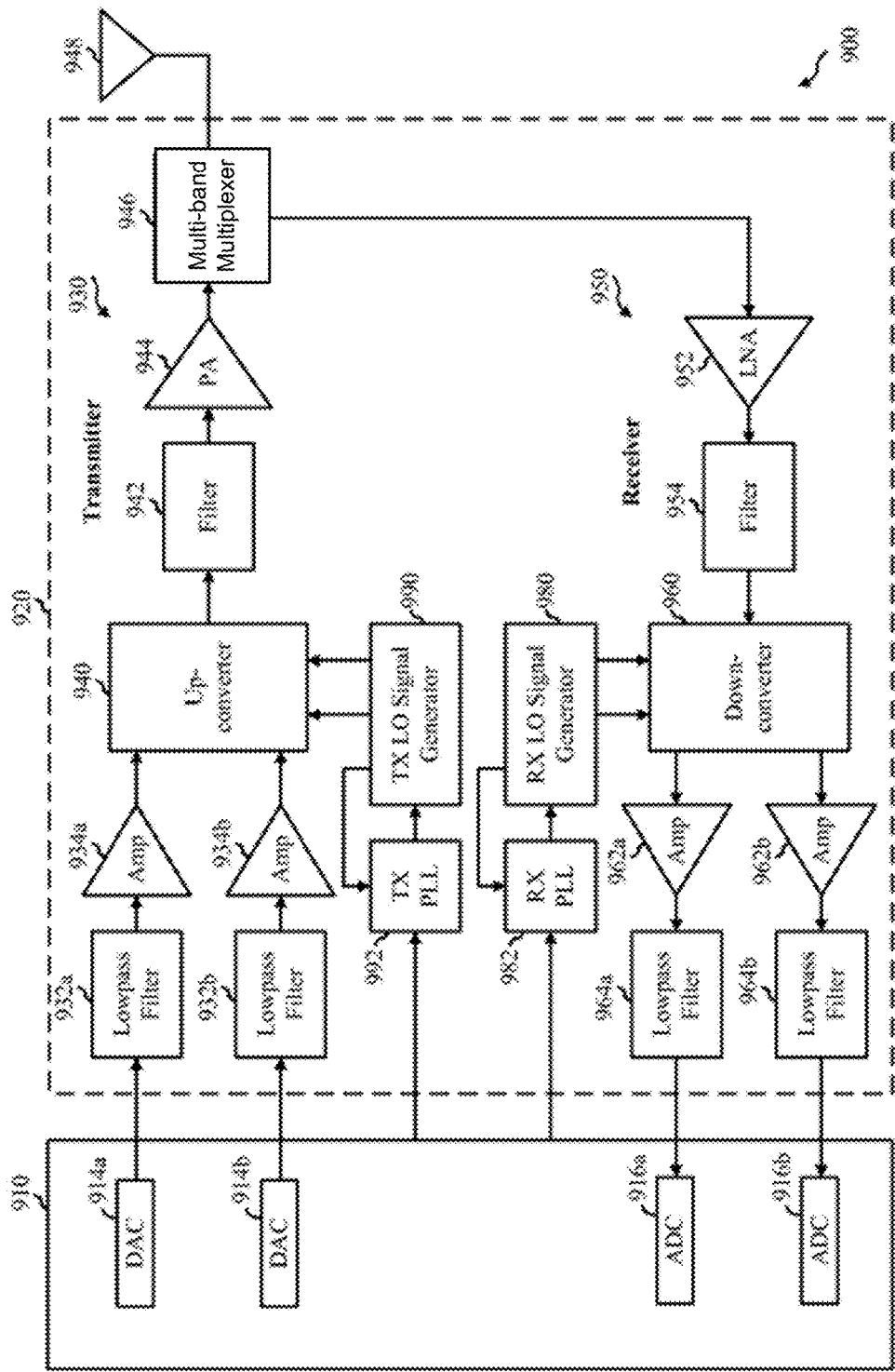
FIG. 9 is a block diagram of an example of radio frequency components of a user equipment including a multi-band multiplexer configured to perform multi-band operations, according to one or more of the presently described aspects.

Referring to FIG. 9, in an aspect, a UE (e.g., UE 112) may include a system 900, wherein the system 900 may include RF components such as an antenna (e.g., antenna 948, or antenna 102 in FIG. 1), a RF front end (e.g., the RF front end 104), a transmitter (e.g., a transmitter 124) and a receiver (e.g., a receiver 122). In addition, system 900 may include a multiplexer 946 (e.g., the multi-band multiplexer 114) configured to perform multi-band operations as described herein. In some implementation, system 900 may perform multi-band operations according to at least one of the multiplexing schemes in FIGS. 3-7.

In an example, the system 900 may include a signal conversion component 910 and a communication component 920. The signal conversion component 910 may include one or more digital-to-analog converters (DACs) (e.g., 914a and 914b) and one or more analog-to-digital converters (ADCs) (e.g., 916a and 916b). The communication component 920 may include a transmitter 930 and a receiver 950. In some implementations, in addition to the multiplexer 946, the communication component 920 may also comprise one or more RF components, which may include low-pass filters (932a, 932b, 964a, 964b), amplifiers (934a, 934b, 962a, 962b), an up-convertor 940, a down-convertor 960, filters (942, 954), a PA 944, an LNA 952, a transmission (TX)

phase-locked loop (PLL) 992, a reception (RX) PLL 982, a TX local oscillator (LO) signal generator 990, or a RX LO signal generator 980, as shown in FIG. 9.

Several aspects of a telecommunication system have been presented with reference to an LTE/LTE-A or a 5G communication system. As those skilled in the art will readily appreciate, various aspects described throughout this disclosure may be extended to other telecommunication systems, network architectures and communication standards.

By way of example, various aspects may be extended to other communication systems such as satellite, radar systems, and cellular systems, High Speed Downlink Packet Access (HSDPA), High Speed Uplink Packet Access (HSUPA), High Speed Packet Access Plus (HSPA+) and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. Moreover, nothing disclosed herein is intended to be dedicated to the public regardless of whether such disclosure is explicitly recited in the claims.

What is claimed is:

1. A multiplexer for multi-band wireless communications, comprising:
   at least one tuning component configured to transmit or receive at least one signal within a frequency band that is selected from a plurality of frequency bands; and
   at least one combining component, communicatively coupled with the at least one tuning component, configured to transmit or receive the at least one signal within the selected frequency band and comprising impedance transformation circuits configured to transform impedances of a non-operational signal path of the multiplexer to present a load to an operational signal path of the multiplexer,
   wherein the at least one tuning component is integrated on a chip and the at least one combining component is not integrated on the chip.

2. The multiplexer of claim 1, wherein the impedance transformation circuits are on at least a module substrate or a printed circuit board (PCB).

3. The multiplexer of claim 2, wherein the load is a reactive load.

4. The multiplexer of claim 1, wherein the at least one combining component comprises two or more combining components configured to combine or split the at least one signal, wherein each of the two or more combining components is associated with a respective signal of the at least one signal.

5. The multiplexer of claim 1, wherein the at least one tuning component comprises one or more shunt-based switches and one or more band-select components used for adjusting to transmit or receive the at least one signal within the frequency band.

6. The multiplexer of claim 5, wherein the one or more band-select components comprises a tunable reactance.

7. The multiplexer of claim 5, wherein the at least one tuning component comprises at least two sets of tuning components, wherein each set of tuning components comprises at least two shunt-based switches and at least a band-select component, and wherein each set of tuning components is configured in a transmission mode or a reception mode.

8. The multiplexer of claim 7, wherein each of the at least one combining component is associated with a respective set of tuning components of the at least two sets of tuning components.

9. The multiplexer of claim 5, wherein at least two of the shunt-based switches forms a single-pole double-throw (SPDT) switch or a single-pole N-throw (SPNT) switch.

10. The multiplexer of claim 1, wherein the multiplexer is configured to transmit or receive millimeter-wave signals.

11. The multiplexer of claim 1, wherein the multiplexer is configured to operate in a time-division duplexing (TDD) mode.

12. The multiplexer of claim 1, wherein the multiplexer is communicatively coupled with at least one antenna, a transceiver, a radio frequency (RF) module, or an RF cable.

13. The multiplexer of claim 12, wherein the transceiver is communicatively coupled with multiple antennas simultaneously.

14. The multiplexer of claim 1, wherein the multiplexer is communicatively coupled with one or more wideband amplifiers including at least a low-noise amplifier (LNA) or a power amplifier (PA).

15. The multiplexer of claim 14, wherein the at least one tuning component is incorporated into at least a matching network or circuit of the one or more wideband amplifiers.

16. A method of multi-band wireless communications, comprising:
   selecting a frequency band from a plurality of frequency bands;
   adjusting at least one tuning component to transmit or receive at least one signal within the selected frequency band;
   transmitting or receiving the at least one signal within the selected frequency band using at least one combining component; and
   transforming impedances of a non-operational signal path of a multiplexer to present a load to an operational signal path of the multiplexer using impedance transformation circuits, wherein the multiplexer comprises the at least one tuning component and the at least one combining component and wherein the at least one tuning component is integrated on a chip and the at least one combining component is not integrated on the chip.

17. The method of claim 16, wherein the impedance transformation circuits are on at least a module substrate or a printed circuit board (PCB).

18. The method of claim 16, wherein the at least one tuning component comprises at least two shunt-based switches, and wherein the adjusting comprises using the at least two shunt-based switches to form a single-pole double-throw (SPDT) switch or a single-pole N-throw (SPNT) switch and switch paths for the at least one signal.

19. The method of claim 16, wherein the adjusting comprises adjusting at least a tunable reactance of the at least one tuning component.

20. The method of claim 16, wherein the adjusting comprises switching the at least one signal between two different frequency bands of the plurality of frequency bands.

21. The method of claim 16, wherein the adjusting comprises switching between signal transmission and reception.

22. The method of claim 16, further comprising:
communicating with one or more wideband amplifiers; and
incorporating the at least one tuning component into at least a matching network or circuit of the one or more wideband amplifiers.

23. A multiplexer for multi-band wireless communications, comprising:
means for selecting a frequency band from a plurality of frequency bands;
means for adjusting at least one tuning component to transmit or receive at least one signal within the selected frequency band;
means for transmitting or receiving the at least one signal within the selected frequency band using at least one combining component; and
means for transforming impedances of a non-operational signal path of a multiplexer to present a load to an operational signal path of the multiplexer using impedance transformation circuits,
wherein the multiplexer comprises the at least one tuning component and the at least one combining component and wherein the at least one tuning component is integrated on a chip and the at least one combining component is not integrated on the chip.

24. A non-transitory computer-readable medium storing computer code executable by a processor for multi-band wireless communications, comprising:
code for selecting a frequency band from a plurality of frequency bands;
code for adjusting at least one tuning component to transmit or receive at least one signal within the selected frequency band;
code for transmitting or receiving the at least one signal within the selected frequency band using at least one combining component; and
code for transforming impedances of a non-operational signal path of a multiplexer to present a load to an operational signal path of the multiplexer using impedance transformation circuits,
wherein the multiplexer comprises the at least one tuning component and the at least one combining component and wherein the at least one tuning component is integrated on a chip and the at least one combining component is not integrated on the chip.

25. The non-transitory computer-readable medium of claim 24, wherein the at least one tuning component comprises at least two shunt-based switches, and wherein the code for adjusting comprises code for using the at least two shunt-based switches to form a single-pole double-throw (SPDT) switch or a single-pole N-throw (SPNT) switch and switch paths for the at least one signal.

26. The non-transitory computer-readable medium of claim 24, wherein the code for adjusting comprises code for adjusting at least a tunable reactance of the at least one tuning component.

27. The non-transitory computer-readable medium of claim 24, further comprising:
code for communicating with one or more wideband amplifiers; and
code for incorporating the at least one tuning component into at least a matching network or circuit of the one or more wideband amplifiers.

28. The non-transitory computer-readable medium of claim 24, wherein the impedance transformation circuits are on at least a module substrate or a printed circuit board (PCB).

29. The non-transitory computer-readable medium of claim 24, wherein the code for adjusting comprises code for switching the at least one signal between two different frequency bands of the plurality of frequency bands.

30. The non-transitory computer-readable medium of claim 24, wherein the code for adjusting comprises code for switching between signal transmission and reception.

* * * * *